United States Patent [19]

Suehiro et al.

[11] Patent Number: 4,865,772

[45] Date of Patent: Sep. 12, 1989

[54] COPPER THICK FILM CONDUCTOR COMPOSITION

[76] Inventors: Masatoshi Suehiro, 176, Shimoaburakake-cho, Fushimi-ku, Kyoto-shi, Kyoto-fu; Masashi Echigo, 11, Katagiharaenomoto-cho, Nishikyo-ku, Kyoto-shi, Kyoto-fu; Yutaka Mitsune, 24-902, Hourai 2-chome, Daito-shi, Osaka-fu; Masami Sakuraba, 2, Takenodai, Nagaokakyo-shi, Kyoto-fu; Seiichi Nakatani, 11-29-16, Korigaoka, Hirakata-shi, Osaka-fu; Tsutomu Nishimura, 12, Todounishinaka, Uji-shi, Kyoto-fu, all of Japan

[21] Appl. No.: 271,543

[22] Filed: Nov. 15, 1988

[30] Foreign Application Priority Data

Jan. 26, 1988 [JP] Japan .................................. 63-15275

[51] Int. Cl.$^4$ .............................................. H01B 1/06
[52] U.S. Cl. ..................................... 252/512; 252/518
[58] Field of Search ................................ 252/512, 518

[56] References Cited

U.S. PATENT DOCUMENTS

| | | | |
|---|---|---|---|
| 4,172,919 | 10/1979 | Mitchell | 252/512 |
| 4,323,483 | 4/1982 | Rellick | 252/512 |
| 4,514,321 | 4/1985 | Siuta | 252/512 |
| 4,521,329 | 6/1985 | Siuta | 252/514 |
| 4,540,604 | 9/1985 | Siuta | 427/96 |
| 4,623,482 | 11/1986 | Kuo et al. | 252/518 |
| 4,687,597 | 8/1987 | Siuta | 252/512 |
| 4,695,403 | 9/1987 | Nishimura et al. | 252/518 |

*Primary Examiner*—Josephine Barr
*Attorney, Agent, or Firm*—Armstrong, Nikaido, Marmelstein, Kubovcik & Murray

[57] ABSTRACT

A copper-containing thick film conductor composition comprising 55 to 95% by weight of an inorganic powder and 45 to 5% by weight of an organic medium, said inorganic powder comprising 100 parts by weight of a copper powder, 0.05 to 3 parts by weight of a zinc oxide powder, 1 to 7 parts by weight of a lead borate glass powder, 0.2 to 5 parts by weight of a borosilicate glass powder and 0 to 10 parts by weight of a copper snboxide powder having an average particle size of not more than 1.0 $\mu$m. The composition of the present invention is excellent in solderability and adhesive strength to the substrate.

8 Claims, No Drawings

COPPER THICK FILM CONDUCTOR COMPOSITION

BACKGROUND OF THE INVENTION

The present invention relates to a copper-containing conductor composition, and more particularly to a composition for providing a thick film copper conductor which is formed into conductor patterns or electrodes on, mainly, ceramic substrates.

Thick film conductor compositions are composed of, generally, a conductive metal, an inorganic oxide and a glass powder as an inorganic bonding agent, which are in finely divided form and are dispersed in an organic medium. The conductive metal which is one ingredient in the thick film conductor composition is ordinarily gold, silver, palladium, platinum, or mixtures and alloys thereof. However, these metals are noble metals, and they are expensive and have large fluctuations in price. Accordingly, it has been strongly expected to substitute base metals, particularly copper metal, which are cheap and have small fluctuations in price, for the noble metals.

As to the copper-containing thick film conductor composition, Japanese Examined Patent Publication No. 2398/1984 discloses a composition composed of a copper powder and a copper oxide powder, and a lead oxide powder and/or a bismuth oxide powder, which does not require the use of a glass binder. In this system, however, the copper, that is, the surface of the copper thick film conductor is oxidized by oxygen which is introduced in a trace amount into a firing atmosphere, usually a nitrogen atmosphere, in order to decompose or volatilize organic matters, thus resulting in deterioration of solderability (wettability by solder). Japanese Unexamined Patent Publication No. 70746/1985 discloses a composition composed of a copper powder and an inorganic binder, and tungsten, molybdenum or rhenium, and teaches that the solderability is improved by utilizing the property of tungsten, molybdenum or rhenium to catch oxygen. These metals are, however, reacted with oxygen to produce metal oxides capable of subliming or volatile metal oxides, thus often resulting in contamination of the inside of a firing furnace or deposition of the metal oxides on a circuit.

U.S. Pat. No. 4,521,329 to Siuta et al is directed to copper conductor compositions comprising metallic copper particles, a specific amount of copper oxide particles and an inorganic binder, which are dispersed in an organic medium. The patent discusses in its Example that zinc oxide is used in a small amount as one ingredient of the glass frit, but it is silent with respect to the use of a powder of zinc oxide per se as the inorganic binder. Zinc oxide contained in the glass frit is not in the state of particles but is an ingredient of the glass frit, and is bulkily and uniformly distributed, so that it cannot be formed into a barrier layer or zone capable of preventing to bleed the glass frit and exists thinly in the copper conductor, therefore the zinc oxide contained in the glass frit as one ingredient cannot prevent the bleeding of the glass frit, resulting in not only poor solderability but also deterioration of adhesion strength after aging.

An object of the present invention is to improve the defects of conventional copper thick film conductors, that is, the poor solderability and poor adhesive strength to substrates, particularly deterioration of adhesive strength to substrates in various aging tests.

This and other objects of the present invention will become apparent from the description hereinafter.

SUMMARY OF THE INVENTION

As a result of repeating the present inventors' earnest studies for improving the above-mentioned defects, the poor solderability, the deterioration of adhesive strength, and the like, it has now been found that when 0.05 to 3 parts by weight of a zinc oxide powder, 1 to 7 parts by weight of a lead borate glass powder, 0.2 to 5 parts by weight of a borosilicate glass powder and 0 to 10 parts by weight of a copper suboxide powder having an average particle size of not more than 1.0 μm are admixed with 100 parts by weight of a copper powder, the adhesive strength between the metallic copper and a alumina ceramic or beryllia ceramic substrate (hereinafter referred to as "substrate") can be improved and the excellent solderability can be obtained.

In accordance with the present invention, there is provided a copper-containing thick film conductor composition comprising.

(A) 55 to 95 % by weight of an inorganic powder and
(B) 45 to 5 % by weight of an organic medium, the inorganic powder comprising 100 parts by weight of a copper powder, 0.05 to 3 parts by weight of a zinc oxide powder, 1 to 7 parts by weight of a lead borate glass powder and 0.2 to 5 parts by weight of a borosilicate glass powder.

DETAILED DESCRIPTION

In the copper-containing thick film conductor composition of the present invention, the great characteristic is that the lead borate glass powder which is a composite glass having a large specific gravity and a low softening point is used as one of glass frit powder. Since the lead borate glass powder is low in softening point and is large in specific gravity, as mentioned above, it can melt at relatively low temperature upon firing and is distributed on the substrate side, and it acts to strongly stick the copper thick film conductor to the substrate as an adhesive.

In the composition of the present invention, as the other glass frit powder, the borosilicate glass powder is used. The borosilicate glass powder acts mainly to prevent bleeding of the lead borate glass powder from the copper-containing thick film conductor upon firing. Also, it acts to improve the adhesive strength between the copper thick film conductor and the substrate.

The other characteristic of the present invention is to use the zinc oxide powder as the inorganic oxide powder.

The zinc oxide powder is distributed between the layer rich in glass frits on the substrate and the layer rich in metallic copper to form a barrier layer in the copper thick film conductor obtained by firing, thereby preventing to bleed the glass frits on the surface of the conductor, resulting in that the solderability does not become poor. Moreover, a part of the zinc oxide powder is reacted with the glass-rich layer or the substrate to heighten the adhesive strength. Also, the zinc oxide powder greatly prevents the lowering of the adhesive strength after heat-aging. That is, the deterioration of the adhesive strength after aging at 150° C. is caused as follows: Tin in a solder (Sn-Pb alloy) provided on the conductor surface diffuses into the copper conductor during aging to form an alloy of copper and tin. When the produced Cu-Sn alloy reaches to the interface between the conductor and the alumina or beryllia substrate, it destroys the adhesion of the conductor to the substrate. However, when the barrier layer of zinc oxide is formed between the copper-rich layer and the glass-rich layer, it is prevent to penetrate the Cu-Sn alloy into the interface between the substrate and the copper conductor to prevent the lowering of the adhesive strength even after aging.

In the present invention, it is preferable to add the copper suboxide powder having the average particle size of not more than 1.0 μm to the zinc oxide powder as the inorganic oxide powder. The copper suboxide powder is reacted with alumina in the alumina ceramic substrate to form copper aluminate at the interface between the copper thick film conductor and the alumina ceramic substrate, thus resulting in improvement of the adhesive strength between the copper thick film conductor and the substrate. Further, a part of the fine copper suboxide particles are reduced with gas produced by decomposing the organic matters to produce very active fine copper particles, and the active copper particles act to promote the sintering of the copper-containing thick film conductor composition. The smaller the particle size of the copper suboxide powder, the better the above-mentioned effects of the copper suboxide powder.

The copper suboxide powder used herein means cuprous oxide powder, which may include a trace amount of a metallic copper powder and a cupric oxide powder.

In the present invention, the amount of the lead borate glass powder is from 1 to 7 parts by weight, preferably from 2 to 6 parts by weight, based on 100 parts by weight of the copper powder. When the amount of the lead borate is less than 1 part by weight, the adhesion strength between the substrate and the copper conductor is lowered. When the amount is more than 7 parts by weight, the glass frit bleeds from the copper thick film conductor.

The borosilicate glass powder is added to the composition in order to improve the adhesion strength between the copper and the lead borate glass and to prevent the bleeding of the lead borate glass in case of repeatedly firing of the composition. Lead borosilicate and zinc borosilicate are preferred, because of good compatibility with the lead borate glass. The amount of the borosilicate glass powder is from 0.2 to 5 parts by weight, preferably from 1 to 4 parts by weight, based on 100 parts by weight of the copper powder. When the amount of the borosilicate glass powder is less than 0.2 part by weight, the effects of the borosilicate glass powder cannot be obtained and the adhesive strength is lowered by repeatedly firing. When the amount is more than 5 parts by weight, the borosilicate bleeds on the surface of the obtained copper thick film conductor to deteriorate the solderability.

These glass powders, both the lead borate glass powder and the borosilicate glass powder have an average particle size of 0.1 to 10 μm, preferably from 0.5 to 5 μm.

As the inorganic oxide powder, the zinc oxide powder is used, and the copper suboxide powder may be added thereto as occasion demands. The amount of the zinc oxide is from 0.05 to 3 parts by weight, preferably from 0.1 to 2 parts by weight, more preferably from 0.3 to 1.5 parts by weight, based on 100 parts by weight of the copper powder. When the amount of the zinc oxide is less than 0.05 part by weight, the effects due to the addition of zinc oxide cannot be obtained. When the amount is more than 3 parts by weight, the zinc oxide bleeds on the copper thick film conductor surface, resulting in the poor solderability.

The amount of the copper suboxide powder is from 0 to 10 parts by weight, preferably from 3 to 8 parts by weight, based on 100 parts by weight of the copper powder. When the amount of the copper suboxide powder is more than 10 parts by weight, the solderability becomes poor.

In addition to the above-mentioned inorganic oxide powders, other inorganic oxide powders such as a bismuth oxide powder and a cadmium oxide powder may be added to the composition of the present invention as the inorganic oxide powder so long as the total amount of all inorganic oxide powders does not exceed 13 parts by weight based on 100 parats by weight of the copper powder.

The average particle size of the inorganic oxide powders other than the copper suboxide powder is from 0.1 to 10 μm, preferably from 0.5 to 5 μm. The average particle size of the copper suboxide powder is not more than 1.0 μm, preferably not more than 0.8 μm. When the average particle size of the copper suboxide powder is more than 1.0 μm, the solderability of the copper thick film conductor is lowered.

The copper powder used in the present invention has an average particle size of 0.1 to 10 μm, preferably from 0.5 to 5 μm.

As the organic medium, organic liquids generally incorporated in thick film conductor compositions are applicable to the present invention without any limitation. Examples of the organic mediums are, for instance, a solvent such as an aliphatic alcohol, an ester of aliphatic alcohol, e.g., acetate or propionate of an aliphatic alcohol, a terpene e.g. wood turpentine oil, a terpineol; a solution wherein a resin such as a polymethacrylate of lower alcohol or ethyl cellulose is dissolved in the above-mentioned solvent; and the like.

The composition of the present invention may contain other additives such as a dispersing agent. As each ingredient of the composition of the present invention, a good on the market may be used.

The copper-containing thick film conductor composition is composed of 55 to 95% by weight, preferably from 60 to 90% by weight, of the inorganic solid matter comprising the copper powder, the inorganic oxide powders and the glass powders, and 45 to 5% by weight, preferably from 40 to 10% by weight, of the organic medium. When the inorganic solid matter content is less than 55% by weight, the stable paste of the copper thick film conductor composition cannot be obtained. On the other hand, when the content is more than 95% by weight, the composition cannot be formed into a paste.

As the substrate in the invention, the alumina ceramic substrates are used and also the beryllia ceramic substrates can be used.

The copper thick film conductor composition is prepared by kneading the copper powder, the inorganic oxide powders and the glass powders with the organic medium to disperse the inorganic ingredients in the organic medium. Any kneading manners are applicable to the present invention, for instance, all of the ingredients are pre-kneaded by using a universal kneader and then kneaded by using a three roll mill. The obtained composition is in the state of a paste. The composition is applied to the alumina or beryllia ceramic substrate by screen printing, and the printed pattern is dried at 120° C. for 10 to 15 minutes. The dried pattern is finally fired at a temperature range of 850° to 1060° C. The overall firing procedure extends over a period of 30 to 60 minutes, keeping the peak firing temperature for about 5 to about 10 minutes.

The present invention is more specifically described and explained by means of the following Examples, in which all % are by weight unless otherwise noted. It is to be understood that the present invention is not limited to the Examples, and various changes and modifications may be made in the invention without departing from the spirit and scope thereof.

EXAMPLES 1 TO 14

A universal mixer was charged with a copper powder, a zinc oxide powder, a lead borate glass powder, a borosilicate glass powder, a copper suboxide powder and an organic medium according to the formulation shown in Table 1, and the mixture was pre-kneaded for 24 hours.

As the copper powder, three different copper powders having the following properties were used.

| Designation Properties | Copper powder | | |
|---|---|---|---|
| | A | B | C |
| Average particle size ($\mu$m) | 1.0 | 2.2 | 3.0 |
| Specific surface area (m$^2$/g) | 0.85 | 0.56 | 0.4 |

The used zinc oxide powder was an extra pure reagent and had an average particle size of 0.5 $\mu$m, which was commercially available from Takeuchi Yakuhin Kabushiki Kaisha.

The used copper suboxide powder had an average particle size of 0.5 $\mu$m, and a specific surface area of 3.35 to 4.13 m$^2$/g.

The used bismuth oxide powder had an average particle size of 2.0 $\mu$m and a Tap density of 2.1 g/cm$^3$.

As the lead borate glass powder, two different lead borate glass powders having the following properties were used.

| Designation Properties | Lead borate | |
|---|---|---|
| | A | B |
| Softening point (°C.) | 350 | 400 |
| Density (g/cm$^3$) | 7.19 | 6.85 |
| Average particle size ($\mu$m) | 3.5 | 4.5 |

As the borosilicate glass powder, four different borosilicate glass powder having the following properties were used.

| Designation Properties | Borosilicate | | | |
|---|---|---|---|---|
| | Lead borosilicate | | Zinc borosilicate | |
| | A | B | C | D |
| Softening point (°C.) | 480 | 430 | 610 | 635 |
| Density (g/cm$^3$) | 5.38 | 5.77 | 3.93 | 3.78 |
| Average particle size ($\mu$m) | 5.3 | 3.8 | 4.2 | 2.5 |

The used organic medium was composed of 6.0% of ethyl cellulose (100 cp), 46.0% of terpineol and 48.0% of dibutyl phthalate.

The composition was mixed by passing through a three roll mill twelve times and then degassed in the universal mixer under in vacuo to give a copper-containing thick film conductor composition in the state of a paste. The obtained paste was applied to a 96% alumina substrate by using a screen printer to give a printed pattern. The printed pattern was dried at 120° C. for 10 minutes by using a hot-air dryer, and then fired in a belt conveyor furnace under a nitrogen atmosphere for one cycle time of 40 minutes. The firing profile is that the peak firing temperature is 900° C., and the peak firing temperature is kept for 7 minutes. The firing operation was repeated three times (three cycles).

With respect to the obtained conductor, the solderability and the adhesion strength were measured. The results are shown in Table 2.

[Solderability]

After conducting the screen-printing, the printed pattern is fired as mentioned above to give a pattern (six 1 mm×1 mm pads and twelve 2 mm×2 mm pads).

The pattern is dipped in XA-100, which is a tradename for solder flux made by Tamura Kaken Kabushiki Kaisha, then is submerged in the solder (63% Sn—37% Pb) having a temperature of 230°±5° C. for 3±0.5 seconds, and withdrawn. Solderability is determined by observation of the percent of solder coverage area on the pad parts. When the percent of the solder coverage area to the area of the total pads is not less than 95%, it is estimated that the solderability is good, and when the percent of the solder coverage is less than 95%, it is estimated that the solderability is poor. In Table 2, O shows that the solderability is good after firing three times, Δ shows that the solderability is poor after firing two times, and X shows that the solderability is poor after firing one time.

[Adhesion strength]

After conducting the screen-printing, the printed pattern is fired, as mentioned above to give a pattern (eight 1 mm×1 mm pads).

The pattern is dipped in XA-100, then is submerged in the solder (63% Sn—37% Pb) having a temperature of 230°±5° C. for 3±0.5 seconds, and withdrawn.

Tinned copper wire having a diameter of 0.8 mm $\phi$ were attached to the 1 mm×1 mm pads by a soldering iron. As to the obtained samples, the adhesive strength is measured by using a pull taster, commercially available from Kabushiki Kaisha Shimdzu Seisakusho under the tradename "Autograph", at a pull rate of 100 mm/min. at the time when the copper thick film conductor is pulled off from the substrate. The adhesive strength is measured before aging (initial adhesive strength), after aging the sample at 150°±2° C. for 100 hours (adhesive strength after heat-aging) and after allowing the sample to stand at 121° C. for 100 hours under 2 atmospheres (adhesive strength after PCT-aging). The results shown in Table 2 are averages of three samples, that is, 24 pads.

COMPARATIVE EXAMPLES 1 TO 6

The procedure of Example 1 was repeated except that each ingredient in a conductor composition shown in Table 1 was used to give a copper thick film conductor composition.

A printed pattern was prepared from the obtained composition in the same manner as in Example 1.

The solderability and adhesive strength were measured in the same manner as in Example 1.

The results are shown in Table 2.

TABLE 1

| | Copper powder | | Amount of inorganic oxide powder (%) | | |
|---|---|---|---|---|---|
| | Kind | Amount (%) | Zinc oxide | Copper suboxide | Bismuth oxide |
| Ex. No. | | | | | |
| 1 | (A) | 72 | 1.7 | 6.0 | — |
| 2 | (B) | 72 | 1.7 | 5.0 | — |
| 3 | (C) | 72 | 0.7 | 4.0 | — |
| 4 | (A) | 72 | 0.3 | 2.0 | 3.5 |
| 5 | (A) | 74 | 1.0 | 5.0 | 1.5 |
| 6 | (C) | 72 | 1.5 | — | 5.0 |
| 7 | (A) | 74 | 1.0 | 5.0 | 1.5 |
| 8 | (A) | 72 | 1.5 | 4.0 | 2.0 |
| 9 | (A) | 73 | 2.0 | 1.5 | — |
| 10 | (A) | 74 | 2.0 | — | — |
| 11 | (A) | 78 | 0.5 | — | — |
| 12 | (B) | 72 | 1.0 | 5.0 | — |
| 13 | (B) | 72 | 1.0 | 5.0 | — |
| 14 | (C) | 72 | 1.0 | 5.0 | — |
| Com. Ex. | | | | | |
| 1 | (A) | 73 | 1.0 | 5.0 | — |
| 2 | (A) | 72 | — | 5.0 | — |
| 3 | (A) | 72 | 1.0 | 5.0 | — |
| 4 | (A) | 72 | 1.0 | 8.0 | — |
| 5 | (A) | 72 | — | — | — |
| 6 | (A) | 72 | — | 5.0 | — |

| | Lead borate glass powder | | Borosilicate glass powder | | Amount of organic medium (%) |
|---|---|---|---|---|---|
| | Kind | Amount (%) | Kind | Amount (%) | |
| Ex. No. | | | | | |
| 1 | (A) | 3.0 | (A) | 2.3 | 15 |
| 2 | (A) | 4.0 | (A) | 2.3 | 15 |
| 3 | (A) | 5.0 | (A) | 2.3 | 15 |
| 4 | (A) | 2.7 | (B) | 3.5 | 16 |
| 5 | (B) | 1.0 | (A) | 2.5 | 15 |
| 6 | (B) | 3.0 | (B) | 2.5 | 16 |
| 7 | (B) | 1.0 | (C) | 2.5 | 15 |
| 8 | (B) | 3.0 | (D) | 2.5 | 15 |
| 9 | (B) | 3.0 | (A) | 0.5 | 20 |
| 10 | (A) | 3.0 | (C) | 1.0 | 20 |
| 11 | (A) | 2.0 | (D) | 3.5 | 16 |
| 12 | (A) | 1.5 | (A) | 2.5 | 17 |
| | | | (C) | 1.0 | |
| 13 | (A) | 1.5 | (A) | 1.0 | 17 |
| | | | (C) | 2.5 | |
| 14 | (A) | 1.5 | (A) | 1.0 | 17 |
| | | | (D) | 2.5 | |
| Com. Ex. | | | | | |
| 1 | — | — | (A) | 3.0 | 18 |
| 2 | (A) | 1.5 | (A) | 3.5 | 18 |
| 3 | (A) | 1.5 | (A) | 4.5 | 16 |
| 4 | (A) | 1.5 | (A) | 2.5 | 15 |
| 5 | — | — | (C) | 4.5 | 23.5 |
| 6 | — | — | (C) | 2.5 | 20.5 |

TABLE 2

| | | Adhesive Strength (kg/mm$^2$) | | |
|---|---|---|---|---|
| | Solderability | Initial ashesive strength | Heat-aging strength (150° C., 100 hours) | PCT-aging strength (121° C., 2 atm., 100 hours) |
| Ex. No. | | | | |
| 1 | O | 1.2 | 0.7 | 0.6 |
| 2 | O | 1.0 | 0.8 | 0.6 |
| 3 | O | 1.4 | 0.6 | 0.8 |
| 4 | O | 1.1 | 0.5 | 0.6 |
| 5 | O | 1.3 | 0.7 | 0.5 |
| 6 | O | 1.3 | 0.65 | 0.75 |
| 7 | O | 1.0 | 0.5 | 0.6 |
| 8 | O | 1.2 | 0.7 | 0.7 |
| 9 | O | 1.3 | 0.8 | 0.6 |
| 10 | O | 1.1 | 0.7 | 0.5 |
| 11 | O | 1.1 | 0.6 | 0.6 |
| 12 | O | 1.4 | 1.0 | 1.0 |
| 13 | O | 1.2 | 0.9 | 0.9 |
| 14 | O | 1.2 | 0.8 | 0.5 |
| Com. Ex. No. | | | | |
| 1 | O | 0.6 | 0.3 | 0.1 |
| 2 | Δ | 0.8 | 0.2 | 0.1 |
| 3 | Δ | Measurement was | Measurement was | Measurement was |

TABLE 2-continued

|   | Solderability | Adhesive Strength (kg/mm²) | | |
|---|---|---|---|---|
|   |   | Initial ashesive strength | Heat-aging strength (150° C., 100 hours) | PCT-aging strength (121° C., 2 atm., 100 hours) |
|   |   | impossible. | impossible. | impossible. |
| 4 | X | " | " | " |
| 5 | X | " | " | " |
| 6 | X | " | " | " |

The copper-containing thick film conductor composition of the present invention has the effects that the obtained copper thick film conductor is excellent in solderability and adhesive strength to the substrate by using the lead borate glass powder and the borosilicate glass powder as the glass powder and the zinc oxide powder and, if necessary, the copper suboxide powder as the inorganic oxide powder. Also, the copper thick film conductor composition of the present invention containing the zinc oxide powder as the inorganic oxide powder can provide film conductors remarkably improved in solderability and adhesive strength to substrates in comparison with copper conductor compositions wherein the zinc oxide is contained as one ingredient of the glass frit.

In addition to the ingredients used in the Examples, other ingredients can be used in the Examples as set forth in the specification to obtain substantially the same results.

What we claim is:

1. A copper-containing thick film conductor composition comprising 55 to 95% by weight of an inorganic powder and 45 to 5% by weight of an organic medium, said inorganic powder comprising 100 parts by weight of a copper powder, 0.05 to 3 parts by weight of a zinc oxide powder, 1 to 7 parts by weight of a lead borate glass powder and 0.2 to 5 parts by weight of a borosilicate glass powder.

2. The composition of claim 1, which further contain a copper suboxide powder having an average particle size of not more than 1.0 $\mu$m in an amount of up to 10 parts by weight based on 100 parts by weight of said copper powder.

3. The composition of claim 1, wherein the amount of said zinc oxide powder is from 0.1 to 2 parts by weight based on 100 parts by weight of said copper powder.

4. The composition of claim 1, wherein the amount of said zinc oxide powder is from 0.3 to 1.5 parts by weight based on 100 parts by weight of said copper powder.

5. The composition of claim 1, wherein the amount of said lead borate glass powder is from 2 to 6 parts by weight based on 100 parts by weight of said copper powder.

6. The composition of claim 1, wherein the amount of said borosilicate powder is from 1 to 4 parts by weight based on 100 parts by weight of said copper powder.

7. The composition of claim 2, wherein the amount of said copper suboxide powder is from 3 to 8 parts by weight based on 100 parts by weight of said copper powder.

8. The composition of claim 1, which comprises 60 to 90% by weight of said inorganic powder and 40 to 10% by weight of said organic medium.

* * * * *

UNITED STATES PATENT AND TRADEMARK OFFICE
CERTIFICATE OF CORRECTION

PATENT NO. : 4,865,772
DATED : September 12, 1989
INVENTOR(S) : SUEHIRO et al

It is certified that error appears in the above-identified patent and that said Letters Patent is hereby corrected as shown below:

On the cover page, after Item [76] the following should be added:

--[73] Assignee: Dai-Ichi Kogyo Seiyaku Co., Ltd., Kyoto, Dowa Mining Co., Ltd., Tokyo, and Matsushita Electric Industrial Co., Ltd., Kadoma, all of Japan--.

Signed and Sealed this

Sixth Day of November, 1990

*Attest:*

HARRY F. MANBECK, JR.

*Attesting Officer*     Commissioner of Patents and Trademarks